United States Patent
Dwilinski et al.

(10) Patent No.: US 8,754,449 B2
(45) Date of Patent: Jun. 17, 2014

(54) HIGH ELECTRON MOBILITY TRANSISTOR (HEMT) MADE OF LAYERS OF GROUP XIII ELEMENT NITRIDES AND MANUFACTURING METHOD THEREOF

(75) Inventors: Robert Dwilinski, Warsaw (PL); Roman Doradzinski, Warsaw (PL); Jerzy Garczynski, Lomianki (PL); Leszek P. Sierzputowski, Union, NJ (US); Yasuo Kanbara, Anan (JP)

(73) Assignee: Ammono Sp. z o.o., Warsaw (PL)

( * ) Notice: Subject to any disclaimer, the term of this patent is extended or adjusted under 35 U.S.C. 154(b) by 238 days.

(21) Appl. No.: 11/629,125

(22) PCT Filed: Jun. 10, 2005

(86) PCT No.: PCT/PL2005/000036
§ 371 (c)(1), (2), (4) Date: Dec. 11, 2006

(87) PCT Pub. No.: WO2005/122232
PCT Pub. Date: Dec. 22, 2005

(65) Prior Publication Data
US 2008/0067523 A1 Mar. 20, 2008

(30) Foreign Application Priority Data

Jun. 11, 2004 (PL) .......................... 368483
Jun. 25, 2004 (PL) .......................... 368781
Feb. 11, 2005 (PL) .......................... 372746

(51) Int. Cl.
*H01L 29/66* (2006.01)
*H01L 29/20* (2006.01)

(52) U.S. Cl.
USPC .... 257/194; 257/192; 257/615; 257/E21.108; 257/E21.133; 257/E29.249

(58) Field of Classification Search
USPC .......... 257/192, 194, E29.249, E29.246, 615, 257/E21.108, E21.133
See application file for complete search history.

(56) References Cited

U.S. PATENT DOCUMENTS 6,924,159 B2 * 8/2005 Usui et al. ........................ 438/22
7,009,215 B2 * 3/2006 D'Evelyn et al. ............... 257/98

(Continued)

FOREIGN PATENT DOCUMENTS

| WO | 02/101120 A | 12/2002 |
| WO | 03/035945 A | 5/2003 |

(Continued)

OTHER PUBLICATIONS

Porowski, S., "Near Defect Free GaN Substrates", MRS Internet Journal Nitride Semiconductor Research, 1999, 11 pages, vol. 4S1, No. G1.3.

(Continued)

*Primary Examiner* — S. V. Clark
*Assistant Examiner* — Jesse Y Miyoshi
(74) *Attorney, Agent, or Firm* — Smith Patent Office (57) ABSTRACT

The invention relates to a new High Electron Mobility Transistor (HEMT), made essentially of layers of Group XIII element(s) nitride(s). Contrary to currently available transistors of this type, the transistor according to the invention is produced on a homosubstrate made of gallium-containing nitride, has no nucleation layer and its buffer layer is remarkably thinner than in known HEMTs.

Preferably, at least the buffer layer, being a part of the transistor according to the present invention, is produced by epitaxial methods and the direction of growth of said layer in an epitaxial process is essentially perpendicular to the direction of growth of the substrate. The invention relates also to a method of manufacturing of High Electron Mobility Transistor (HEMT).

15 Claims, 2 Drawing Sheets

(56) References Cited

U.S. PATENT DOCUMENTS

| | | | |
|---|---|---|---|
| 2002/0052076 A1* | 5/2002 | Khan et al. | 438/235 |
| 2002/0167023 A1* | 11/2002 | Chavarkar et al. | 257/194 |
| 2004/0124435 A1* | 7/2004 | D'Evelyn et al. | 257/103 |
| 2004/0238810 A1* | 12/2004 | Dwilinski et al. | 257/12 |
| 2005/0151255 A1 | 7/2005 | Ando et al. | |

FOREIGN PATENT DOCUMENTS

| | | | |
|---|---|---|---|
| WO | 03/049193 A | 6/2003 | |
| WO | 03/050849 A | 6/2003 | |
| WO | 03/107431 A | 12/2003 | |
| WO | 2004/003261 A | 1/2004 | |
| WO | 2004/053206 A | 6/2004 | |
| WO | 2004/053208 A | 6/2004 | |

OTHER PUBLICATIONS

Ambacher, O. et al., "Two Dimensional Electron Gases Induced by Spontaneous and Piezoelectric Polarization in Undoped and Doped AlGaN/GaN Heterostructures", Journal of Applied Physics, Jan. 2000, pp. 334-343, vol. 87, No. 1, American Institute of Physics.

Beaumont, B. et al., "Epitaxial Lateral Overgrowth of GaN", Phys. Stat. Sol., 2001, pp. 1-43, vol. 227, No. 1, Wiley-VCH Verlag Berlin GmbH, Berlin.

Binari, S.C. et al., "Molecular Beam Epitaxial Growth of AlGaN/GaN High Electron Mobility Transistors", US Naval Research Laboratory Review, 2003, 3 pages.

"Nitride Electronics", Compound Semiconductor, Jul. 2004, p. 31, No. 6.

"AlN Epilayer Slashes Cost of GaN HEMT" http://compoundsemiconductor.net/articles/news/ 8/12/21, Dec. 2004, 2 pages.

Ye, P.D. et al., "GaN Metal-Oxide-Semiconductor High-Electron-Mobility-Transistor with Atomic Layer Deposited $Al_2O_3$ As Gate Dielectric", Applied Physics Letter, 2005, pp. 1-3 vol. 86, No. 063501, American Institute of Physics.

\* cited by examiner

HIGH ELECTRON MOBILITY TRANSISTOR (HEMT) MADE OF LAYERS OF GROUP XIII ELEMENT NITRIDES AND MANUFACTURING METHOD THEREOF

The invention relates to a new High Electron Mobility Transistor (HEMT), made essentially of layers of Group XIII element(s) nitrides(s). The invention relates also to a method of manufacturing of High Electron Mobility Transistor (HEMT).

First field effect transistors (Metal Oxide Semiconductor Field Effect Transistor, MOSFET) were constructed in late 1970's in Fujitsu laboratories (Mimura, Yokoyama, 1977). They were based on gallium arsenide. Due to higher switching speed, high linearity of signal and other favorable properties, MOSFETs were soon applied in low-noise amplifiers, used mainly in telecommunications. Intensive research directed at systematical improvement of transistors of this type led to construction of High Electron Mobility Transistors (HEMT), in which modern semiconductor materials, such as e.g. gallium nitride or aluminum nitride, are used.

The HEMTs are still mainly used in ground and space communication systems, in particular in satellite telecommunication and television, cellular networks, GPS systems, radiotelescopes and modern radars (phased array radars).

Currently, LDMOS-type (Lateral Diffused Metal-Oxide-Semiconductor) systems, based on silicon, are prevalent in the above-mentioned applications. For example, they constitute 90% of the transistors used in BTS's (base transceiver stations) in cellular telephony. This is mainly due to economic reasons, as LDMOS systems are relatively inexpensive (cheaper both than nitride and gallium arsenide HEMTs, due to the advanced technology and mass manufacturing of those systems) and are characterized by a long mean time to failure (MTTF). Moreover, the position of LDMOS systems as a leader in this area is aided, on one hand, by "inertia" of their recipients (i.e. manufacturers of power amplifiers) and, on the other hand, by the systematic improvement of the parameters of those systems, for example towards achieving higher outputs, higher frequencies, and ability to operate at higher temperatures—appropriately to the needs of the developing communication technologies.

However, it is expected that in the near future a dynamic development of wireless fast data transmission networks (3-rd generation cellular networks) is very likely, e.g. in the W-CDMA standard (Wideband Code-Division Multiple-Access), which uses a signal with the frequency of approx. 2 GHz. Work is also underway on the development of communication techniques in X-Band, i.e. 8-12 GHz. Such networks create a huge demand for modern transistors as well as high-power and high-frequency amplifiers which must be characterized by a perfect linearity of the signal (i.e. produce an amplified signal that is, for all practical purposes, free of any distortions), reliability, and stability of operating parameters in an extended period of time. Preferably, the equipment that is being used should be able to operate under the conditions of varying power output (in the W-CDMA networks the power output indeed varies depending on the traffic density) and a high peak-to-mean mode. Meanwhile, LDMOS systems have proved most useful under stable conditions and with limited power output thus do not meet the parameters required by the new technology. Such requirements can be easier fulfilled by constructing devices that are able to operate under higher voltages, since in the case of present LDMOS structures an increase in voltage results in lower amplification and considerably faster degradation of equipment, whose operation becomes less stable after an extended period of time. In summary, the dominating position of LDMOS systems is currently more due to economic reasons than to their parameters and performance. Consequently, their position may be lost, if they do not satisfactory fulfill technical demands of the currently-developed new communication techniques.

On the other hand, all those requirements are perfectly fulfilled by HEMT structures built of Group XIII element(s) nitride(s), particularly gallium nitride and aluminum nitride. Gallium nitride is characterized by the breakdown voltage higher by one order of magnitude than that of GaAs, as well as higher thermal resistance. Therefore, nitride HEMT transistors can work at higher voltages, which considerably facilitates designing the discussed systems under development. Smaller dimensions of individual parts, particularly gates (as compared with the currently available devices) allow to achieve higher switching rates, thus allowing to amplify the signals with higher frequencies and expand the available band widths. Due to the high thermal resistance of nitrides, the HEMT transistors that are built of nitrides can work at high temperatures, which in turn allows to achieve power output density that is several times higher than that of the devices available on the market. Additionally, nitride structures are characterized by a linearity of the signal, ability to achieve a high power output, and stability of operating parameters throughout an extended period of time. For example, extrapolation of the measurements of electric parameters of a nitric HEMT device made by Nitronex (obtained on a silicon substrate) suggests that those parameters will change by less than 10% in 20 years ("Compound Semiconductor", no. 6, 2004, page 31).

The aforementioned advantages translate into direct benefits resulting from the application of nitride HEMT structures, particularly in modern communication techniques, including 3-rd generation cellular communication networks. In practical terms, the ability to work at higher voltages and achieve higher power outputs and higher amplification means less amplification stages, and thus simpler, smaller, and lighter amplification systems (less transistors in an amplifier). On the other hand, the ability to work in a wide scope of frequencies allows to use a single nitride transistor for three communication bands (e.g. PCS, DCS, UMTS) instead of the several currently available LDMOS systems. Finally, the ability to operate HEMT structures at higher temperature and in the presence of stronger electric fields allows to significantly reduce or even entirely eliminate the necessity to cool amplifier systems. Consequently, it is expected that those systems will become smaller and lighter, as well as less expensive to manufacture and operate. In the case of cellular base transceiver stations it will be possible to place the amplifier and the antenna closer to each other, thus allowing to reduce signal transmission losses (which currently reach approx. 50%), and enabling tower-top mounting of amplifiers (in direct proximity of the antenna). Smaller and lighter amplifier systems that do not require cooling will prove very competitive in satellite telecommunication. It is also possible to construct super low-noise amplifiers that could be used in radio telescopes or modern radars.

The above discussed expected advantages of using nitride devices affect the level of intensity of the research aimed at developing an appropriate HEMT structure, as well as its manufacturing method that could be applied in industry and be economically competitive. Currently HEMT structures are produced on several types of substrates using epitaxial methods (e.g. MOCVD, MBE). The basic problem consists in the lack of appropriate nonconductive homosubstrates for obtaining such structures (e.g. substrates of bulk gallium nitride), since the sufficiently big nitride monocrystals that could be used to produce such substrates were not thus far available. Therefore, it is necessary to use foreign substrates (heterosubstrates)—e.g. of sapphire, silicon, or SiC—where an appropriate nucleation layer is deposited directly onto the substrate, followed by (optionally) a buffer layer, and only then the proper nitride layers are deposited on that layer. However, the use of a heterosubstrate is not an optimal solution, because irrespective of the type of heterosubstrate and the employed technique of manufacturing HEMT devices, the crystalline lattice mismatch and different thermal expansion coefficients of the substrate and of the nitride layers deposited on it become the source of tensions and defects in the obtained material, which causes a dramatic deterioration of the structure, quality and performance of the manufactured devices. Moreover, sapphire substrates are not suitable for high power electronics (due to the relatively low thermal conductivity of sapphire). In this respect, SiC substrates are better, although the technologies used to obtain such substrates are not sufficiently developed as yet, making those substrates expensive to produce. Further problem is SiC doping, required to obtain a compensated (semi-insulating) material. Recently there have been reports on Fujitsu constructing a HEMT transistor on a conductive SiC substrate, on which a thin (10 µm) AlN layer was produced using the HVPE method (http://compoundsemiconductor.net/articles/news/8/12/21). Although this invention eliminates the necessity of using compensated SiC, it does not solve all the other problems caused by the usage of heterosubstrate. Moreover, in this case the known problem of "parasitic conduction" occurs. The parasitic conduction is the result of generation of free carriers on the AlN/SiC interface (eg. S. C. Binari, D. S. Katzer, D. F. Storm, B. V. Shanabrook, E. R. Glaser, and J. A. Roussos, "Molecular Beam Epitaxial Growth of AlGaN/GaN High Electron Mobility Transistors", in 2003 US Naval Research Laboratory Review). Creating of an additional ("parasitic") channel for current flow between the source and the drain considerably deteriorates the parameters of the HEMT transistor. Other known HEMT devices are produced on silicon substrates (Nitronex, Micro GaN) or compensated SiC substrates (Rockwell Scientific Company, RF Micro Devices, Eudyna Devices/Fujitsu). Let us however repeat, that in every such case, the mismatch between the substrate and the epitaxial layers deteriorates the crystalline quality and electrical parameters of a HEMT structure obtained by heteroepitaxy.

Experiments show that a better structural quality of the AlGaN/GaN interface results in a favorable increase in the mobility of carriers within the active area of the device. Moreover, it is known that the quality and performance of HEMT transistors improve with the quality of epitaxial layers ("Journal of Applied Physics", vol. 87, no. 1, 2000, pages 334-344). Currently, the main aim of the research worldwide is to minimize undesired effects resulting from substrate's mismatch, i.e. to provide such a substrate, nucleation layer or the HEMT structure which "levels"—to a possibly largest extent—the disadvantageous influence of the substrate on the crystalline quality of heteroepitaxial layers. In particular, it is expected that—in each of the above cases—it would be possible to obtain considerably better HEMT structures with even better operating parameters, provided that those structures can be produced on homosubstrates, but this possibility has not been—up to now—seriously considered, due to a lack of an industrially applicable method of manufacturing satisfactory compensated homosubstrates.

Moreover, it should be noted that the available heterosubstrates limit the production of HEMT structures to those with AlGaN/GaN interface coinciding with the polar plane C of the nitride crystalline lattice. According to numerous publications, further desired improvement in the performance of nitride HEMT transistors could be achieved by producing them using homosubstrates with non-polar surface (e.g. surface coinciding with the non-polar plane A or M of the nitride crystalline lattice). Consequently, another aim of the research around the world is to provide substrates for epitaxial deposition of nitride layers, having the desired polarity and/or orientation with respect to the crystalline lattice of gallium nitride. In particular, such substrates can be produced from the gallium-containing nitride monocrystals of appropriate size.

Currently used industrial technologies of obtaining nitride monocrystals are not satisfactory as they do not allow to obtain crystals of appropriate size and quality, or their efficiency and industrial applicability is limited.

Some available epitaxial methods, such as for example the MOCVD, HVPE or MBE methods, can be used to produce GaN substrates with the diameter of up to two inches, but they are seriously limited due to the lack of appropriate substrates (particularly nitride homosubstrates). Thus obtained material is characterized by surface dislocation density of at least approx. $10^8/cm^2$ or approx. $10^7/cm^2$ if the Epitaxial Lateral Overgrowth (ELOG) method is applied simultaneously. Such dislocation density is much too high for its possible application for producing HEMT transistors. Additionally, the achieved growth rates make it impossible to obtain a true bulk crystal.

The standard methods of crystallization from melt and the sublimation methods cannot be applied due to the decomposition of nitrides into metals and $N_2$.

In the HNP method such decomposition is inhibited by using the atmosphere of high nitrogen pressure (it is necessary to apply temperatures of approx. 1500° C. and pressures of approx. 1500 MPa, which constitutes a serious limitation considering the bigger scale and industrial applicability of the process). In this way, it is possible to obtain GaN wafers with the dimensions of approx. 10 mm. So far, it has been impossible to achieve seeded growth of gallium nitride using that method. The obtained crystals are the result of the uncontrolled process of spontaneous growth, causing numerous defects in the obtained crystals, such as twinning, edge and screw dislocations, etc.

Promising results were obtained from the application of flux growth methods to obtain gallium-containing nitrides from gallium alloys in the atmosphere of nitrogen. These methods are attractive for industry because of the application of relatively low temperatures and low pressures, although as of now, the FLUX methods are yet to leave the laboratory stage of research. Similarly to the HNP method, the main problem is how to achieve a controlled seeded growth. The first seeding attempts in FLUX processes were presented only in the last few months at several scientific conferences.

U.S. Patent Application Publication No. 2006-0037530 A1 related to International Publication No. WO2004/053206 and U.S. Pat. No. 7,314,517 related to International Publication No WO2004/053208 disclose the method of obtaining bulk monocrystalline gallium-containing nitride by crystallization from supercritical ammonia-containing solution containing alkali metal ions. The characteristic feature of bulk nitride monocrystals obtained using the above-mentioned supercritical ammonia-containing solution is their low dislocation density (approximately $10^4/cm^2$), high electric resistivity (in the case of undoped bulk GaN—several $\Omega \cdot cm$), as well as high crystalline quality (half width of the X-ray rocking curve (FWHM) from the (0002) plane below 60 arcsec—for the Cu K $\alpha_1$ line). Moreover, U.S. Patent Application Publication No. 2006-0037530 A1 and U.S. Pat. No. 7,314,517, both of which are incorporated by reference, disclose that the monocrystals contain Group I elements, in a concentration of at least 0.1 ppm.

Recently a method was developed to obtain gallium-containing nitride monocrystals grown on the seed, essentially without propagating the crystalline defects occurring on the seed. This method was disclosed in the Polish patent applications nos. P-368483 (dated Jun. 11, 2004) and P-368781 (dated Jun. 25, 2004), which have not been published yet. It involves growing a crystal on the seed at least in the direction essentially perpendicular to the direction of the growth of the seed. This method can be used to obtain large bulk monocrystals (3 cm and larger) with exceptionally favorable quality parameters (surface dislocation density preferably approx. $10^2/cm^2$, curvature radius of the crystalline lattice preferably approx. 70 m, and half width of the X-ray rocking curve (FWHM) from the (0002) plane preferably below 40 arcsec (for the Cu K $\alpha_1$ line). Due to the considerable sizes of the obtained crystals it is possible—as needed—to use them to obtain substrates for epitaxy of the desired orientation and polarity (e.g. with the surface coinciding with the polar plane C, or with the surface coinciding with the non-polar plane A or M of the crystalline lattice of gallium-containing nitride). Thus, from the viewpoint of crystalline structure, these are optimal substrates for manufacturing of nitride electronic devices. However, there was still the problem of obtaining an insulating substrate, because—as mentioned above—the thus obtained gallium-containing nitride has the electric resistivity of the order of several $\Omega \cdot cm$, far too low from the viewpoint of manufacturing HEMT structures. Doping attempts, in which the acceptor-type dopants, as e.g. zinc or magnesium, were introduced into the environment of the process, encountered technological obstacles. The presence of said elements in the environment of the process according to the disclosure of WO2004/053206 and WO2004/053208 resulted in a dramatic drop of the growth rate of nitride crystals, and consequently monocrystals of desired size could not be obtained within a reasonable time. Unexpectedly, these obstacles have been overcome by optimizing the parameters of the crystallization process, such as pressure and the temperature distribution, as well as appropriate preparation of feedstock.

It was now unexpectedly discovered that the process of controlled doping of the bulk monocrystals grown as described above at a certain level allows to obtain compensated (semi-insulating—with resistivity of approximately $10^6 \Omega \cdot cm$) material, which gave the inventors an incentive to take up research aiming at using this material to produce homosubstrates for nitride HEMT transistors with optimal quality and electric conductivity (from viewpoint of that particular application).

Therefore, the objective of this invention is to provide HEMT transistors built of layers of gallium-containing nitride deposited in nitride homosubstrate. Another objective of this invention is to provide a method of manufacturing of said HEMT transistors.

According to the invention, the High Electron Mobility Transistor (HEMT), made essentially of layers of Group XIII element(s) nitride(s) (IUPAC, 1989), is formed on a substrate of gallium-containing nitride, made of a single crystal obtained by crystallization from supercritical ammonia-containing solution.

Preferably, the transistor according to the invention is produced on a substrate formed of a single crystal obtained by growth on a seed, at least in the direction essentially perpendicular to the direction of the growth of the seed.

A semi-insulating (compensated) substrate is preferably used to produce the transistor according to the invention.

According to the invention, the transistor is produced on a polar substrate.

Alternatively, the transistor according to the invention is produced on a non-polar substrate.

Preferably, in the transistor according to the invention, the buffer layer is deposited directly on the substrate.

The transistor according to the invention has mean output power in the W-CDMA band (ca. 2 GHz) preferably not lower than 50 W, while the gain is preferably not lower than 25 dB at 60V.

According to the invention, at least the buffer layer is produced by epitaxial methods and the direction of growth of said layer in the epitaxial process is essentially perpendicular to the direction of growth of the substrate.

The invention covers also a method of manufacturing of said HEMT transistors, in which at least the buffer layer is produced by epitaxial methods and the direction of growth of said layer in the epitaxial process is essentially perpendicular to the direction of growth of the substrate.

The HEMT transistors produced on such substrates using epitaxial methods have exceptionally favorable performance parameters (for example, mean output power in the W-CDMA band (ca. 2 GHz)—50 W, gain 25 dB at 60V). They can work in a stable manner at a higher voltage as well as higher power and signal frequencies than the aforementioned known HEMT devices, and it is possible to achieve even a higher amplification. The problem of parasitic conduction is absent in this case.

As the problem of lattice constant mismatch and different thermal expansion coefficients of the substrate and the layers deposited thereon is absent as well—the epitaxial layers, being parts of the HEMT structure according to the invention, are of high quality. It turned out that even further improvement of parameters of the manufactured devices is possible, provided that the epitaxial layers are grown in the direction essentially perpendicular to the direction of growth of the substrate.

Of course, the use of a homosubstrate does not solve all possible technical problems, which may occur in a HEMT structure. Some of the known problems are not a direct consequence of the use of a heterosubstrate and they may appear also in the transistor according to the invention. Such problems should be solved in appropriate way, known to those skilled in the art and in particular—by appropriate modification of the HEMT structure. Thus, the inventive transistor may be modified in order to obtain further improvement of its parameters. High gate leakage current may be used as the example. It was discovered (P. D. Ye et. al., *Appl. Phys. Lett.* 86 063501), that this current can be reduced by about six orders of magnitude by placing a thin dielectric layer (e.g. $Al_2O_3$ or $HfO_2$) below the gate. Of course, similar modification may be applied in the HEMT structure according to the invention.

The present invention is illustrated by the accompanying drawings in which.

Any technical terms used throughout the specification and the claims related to the present invention should be construed according to the definitions given below:

Group XIII element-containing nitride means a nitride of Group XIII element(s) (IUPAC, 1989), i.e. aluminum, gallium and indium either alone or in any combination. Gallium-containing nitride is the most preferred such nitride.

Gallium-containing nitride is a chemical compound containing in its structure at least one atom of gallium and one atom of nitrogen. It includes, but is not restricted to, a binary compound—GaN, a ternary compound—AlGaN, InGaN or a quaternary compound AlInGaN, preferably containing a substantial portion of gallium, anyhow at the level higher than dopant content. The composition of other elements with respect to gallium in this compound may be modified in its structure insofar as it does not collide with the ammonobasic nature of the crystallization technique.

A substrate of bulk mono-crystalline gallium-containing nitride means a monocrystalline substrate of gallium-containing nitride, on which electronic devices such as HEMT may be obtained by MOCVD method or by the methods of epitaxy growth such as HVPE, wherein its thickness is preferably at least 200 μm, more preferably at least 500 μm.

Homosubstrate means a substrate made of the same crystal as the layers deposited on this substrate. For example, when a substrate made of gallium nitride is used for epitaxial deposition of gallium nitride layers, then this substrate is called a homosubstrate.

Heterosubstrate means a substrate made of a crystal different from the layers deposited on this substrate. For example, when a substrate made of sapphire is used for epitaxial deposition of gallium nitride layers, then this substrate is called a heterosubstrate.

Precursor of gallium-containing nitride is a substance or a mixture containing at least gallium and optionally containing elements of Group I (alkali metals), elements of Group II (alkali earth metals), elements of Group XIII (group numbers according to IUPAC 1989), nitrogen and/or hydrogen, and metallic gallium, its alloys or metallic compounds, hydrides, amides, imides, amido-imides and azides, which may form gallium compounds soluble in the supercritical ammonia-containing solvent as defined below.

Gallium-containing feedstock is gallium-containing nitride or its precursor. As a feedstock, GaN obtained by various methods may be used, among others by flux methods, HNP method, HVPE method or poly-crystalline GaN obtained by reaction of metallic gallium with supercritical ammonia-containing solution.

Supercritical ammonia-containing solvent is a supercritical solvent consisting at least of ammonia, which contains one or more types of Group I elements (alkali metals), supporting dissolution of gallium-containing nitride. Supercritical ammonia-containing solvent may also contain derivatives of ammonia and/or mixtures thereof, in particular—hydrazine.

Mineralizer is a substance introducing into the supercritical ammonia-containing solvent one or more Group I element (alkali metal) ions, supporting dissolution of feedstock.

Dissolution of gallium-containing feedstock means either reversible or irreversible process of forming—out of said feedstock—gallium compounds soluble in the supercritical solvent, for example gallium-complex compounds. Gallium complex compounds are complex chemical compounds, in which an atom of gallium is a coordination center surrounded by ligands, such as ammonia molecules ($NH_3$) or their derivatives, like $NH_2^-$, $NH^{2-}$, etc.

Supercritical ammonia-containing solution means a solution obtained as the result of dissolution of gallium-containing feedstock in the supercritical ammonia-containing solvent.

Solubility

Our experiments show that the state of equilibrium may be achieved between the solid (gallium-containing nitride) and the supercritical solution at sufficiently high temperature and pressure. Therefore, the solubility of gallium-containing nitride may be defined as the equilibrium concentration of gallium-complex compounds obtained in the above mentioned process of dissolution of gallium-containing nitride. In this process, the equilibrium concentration, i.e. solubility, may be controlled by changing the composition of solvent, temperature and/or pressure.

Temperature and Pressure Coefficient of Solubility (TCS and PCS)

Negative temperature coefficient of solubility means that the solubility is a decreasing function of temperature if all other parameters are kept constant. Similarly, positive pressure coefficient of solubility means that, if all other parameters are kept constant, the solubility is an increasing function of pressure. Our research allows to state that solubility of gallium-containing nitride in the supercritical ammonia-containing solvent, at least in the temperature range from 300° C. to 550° C., and pressure from 100 MPa to 550 MPa, shows a negative temperature coefficient (negative TCS) and a positive pressure coefficient (positive PCS).

Supersaturation

If the concentration of soluble gallium compounds in the supercritical ammonia-containing solution is higher than the solubility of gallium-containing nitride in specific physico-chemical conditions, then the supersaturation of the supercritical ammonia-containing solution with respect to gallium-containing nitride in those conditions can be defined as the difference between the actual concentration and the solubility. While dissolving gallium-containing nitride in a closed system it is possible to obtain the supersaturation state, for example by increasing temperature or decreasing pressure.

Chemical transport of gallium-containing nitride in the supercritical solution means a continuous process involving dissolution of a gallium-containing feedstock in the supercritical solution, circulation of the gallium-complex compounds within the solution and crystallization of gallium-containing nitride from the supersaturated supercritical solution. Generally, chemical transport may be caused by temperature difference, pressure difference, concentration difference, or other chemical or physical differences between the dissolved feedstock and the crystallization product. Bulk monocrystalline gallium-containing nitride may be obtained in effect of chemical transport between the dissolution and crystallization zones of the autoclave, established by means of temperature difference between the two zones, whereas the temperature in the crystallization zone should be higher than the temperature in the dissolution zone.

Seed is crucial for obtaining a desired bulk gallium-containing nitride monocrystals by crystallization from supercritical ammonia-containing solution. In view of the fact that the quality of the seed is crucial for the crystalline quality of the bulk gallium-containing nitride monocrystals, the seed selected for the process should have possibly high quality. Various structures or wafers having a modified surface can also be used. For example a structure having a number of surfaces spaced adequately far from each other, arranged on a primary substrate and susceptible to the lateral overgrowth of crystalline nitrides may be used as a seed (ELOG structures). Seeds can be produced using various methods, e.g. by growth from gaseous phase, such as HVPE, MOCVD or MBE.

HVPE (Halide Vapor Phase Epitaxy) method refers to a method of deposition of epitaxial layers from gaseous phase, in which (in the case of nitrides) halides of metals and ammonia are used as substrates.

MBE (Molecular Beam Epitaxy) method refers to a method of obtaining epitaxial layers of atomic thickness by depositing molecules from a so-called "molecular beam" on a substrate.

MOCVD (Metallo-Organic Chemical Vapor Deposition) method refers to a method of deposition of epitaxial layers from gaseous phase, in which (in the case of gallium nitride) ammonia and metallo-organic compounds of gallium are used as substrates.

Spontaneous crystallization from the supersaturated supercritical ammonia-containing solution means any undesirable process of nucleation and growth of the gallium-containing nitride crystals taking place at any site within the autoclave except on the surface of the seed. The definition also includes growth on the surface of the seed, in which the grown crystal has an orientation different from that of the seed.

Selective crystallization on a seed means a process of crystallization taking place on the surface of the seed, in the absence of spontaneous crystallization or with spontaneous crystallization occurring in a negligible degree. This process is indispensable for obtaining bulk monocrystals of gallium-containing nitride.

Temperature and Pressure of the Reaction

In the practical example presented in the present specification temperature measurements inside the autoclave have been performed when the autoclave was empty, i.e. without the supercritical ammonia-containing solution. Thus, the temperature values cited in the examples are not the actual temperature values of the process carried out in the supercritical state. Pressure was measured directly or calculated on the basis of physical and chemical data for ammonia-containing solvent at selected process temperature and the volume of the autoclave.

Autoclave, regardless of its from, includes a closed reaction chamber, in which the ammonobasic crystallization process is carried out.

Crystallographic directions c, a or m refer to c, a or m directions of hexagonal lattice, having the following Miller indices: c—[0001], a—[1 1 $\bar{2}$ 0], m—[1 $\bar{1}$ 00].

Crystallographic planes C, A or M refer to C-, A- or M-plane surfaces of hexagonal lattice, having the following Miller indices: C—(0001), A—(1 1 $\bar{2}$ 0), M—(1 $\bar{1}$ 00). The surfaces are perpendicular to the corresponding crystallographic directions (c, a and m).

The direction of growth of the seed is the direction of growth of the crystal, out of which the seed used in this method was made. This direction is determined by the method used to produce the seed. At the same time, this is the main direction of propagation of dislocations in the seed. For example, GaN wafers obtained by HVPE method can be used as seeds in the process of GaN growth by crystallization from supercritical ammonia-containing solution. In the HVPE method, the wafers are grown essentially in the c direction of the gallium nitride hexagonal lattice. Thus, in this case the c direction is the direction of the growth of the seed.

The direction of growth of the substrate is the direction of growth of this part of the crystal, out of which the substrate was made. At the same time, this is the main direction of propagation of dislocations in the substrate. It turns out that epitaxy process, in which the epitaxial layers are grown in the direction essentially perpendicular to the direction of growth of the substrate, results in the layers of a very high quality, as the defects present in the substrate do not propagate in such layers.

Group XIII Element-Terminated Side, Ga-Terminated Side, N-Terminated Side:

In the crystals having the wurtzite structure one can distinguish a crystalline direction (crystalline axis) denoted as c, parallel to the $C_6$ symmetry axis of the crystal. In the crystals of Group XIII element nitrides, having the wurtzite structure, the crystalline planes perpendicular to the c axis (C-planes) are not equivalent. In is a habit to call them Group XIII element-terminated side and nitrogen-terminated side or the surface having Group XIII element polarity or nitrogen polarity, respectively. In particular, in the case of monocrystalline gallium nitride one can distinguish gallium-terminated side (Ga-side) and nitrogen-terminated side (N-side). These sides have different chemical and physical properties (eg. susceptibility to etching or thermal durability). In the methods of epitaxy from the gaseous phase the layers are deposited on the Group XIII element-terminated side.

ELOG (Epitaxial Lateral Overgrowth) is a method of crystal growth from gaseous phase or from supercritical ammonia-containing solution, in which crystals are grown on a special substrate. In the case of gallium nitride crystals, a matrix of parallel ridges (several microns high and several microns wide), having surfaces susceptible to lateral growth, is created on the surface of the substrate. Typically, gallium nitride crystals are grown in the c direction. The ridges are then created along the m direction and the surfaces susceptible to lateral growth coincide with A-planes. In this case, lateral growth is limited to several or several dozen microns and it is finished as soon as the space between the ridges becomes overgrown by the arising crystal. Next, the principal growth of bulk crystal proceeds along the c direction. This way some of the dislocations present in the substrate can be prevented from penetrating into the arising crystal.

Lateral growth in this patent application refers to bulk growth on a seed in the direction perpendicular to the original direction of the growth of the seed. In contrast to ELOG (Epitaxial Lateral Overgrowth), the lateral growth is definitely macroscopic (of the order of dimensions of the seed or even larger). Moreover, the projection of a laterally grown crystal in the direction parallel to the original direction of seed growth goes remarkably beyond the projection of the seed used. In the case of ELOG (Epitaxial Lateral Overgrowth), these two projections are essentially identical.

DETAILED DESCRIPTION OF THE INVENTION

Figure 1:
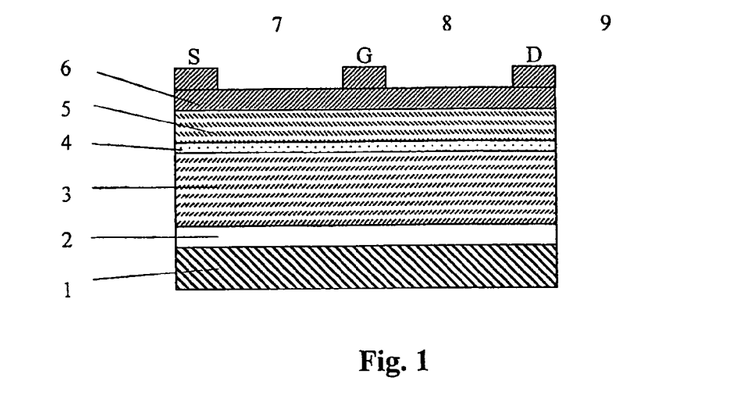
FIG. 1 shows a scheme of a known HEMT structure.

FIG. 1 presents a schematic cross-section of a known HEMT transistor produced on a heterosubstrate (1). The transistor further consists of the buffer layer made of gallium-containing nitride (3) and the layer of mixed gallium-aluminum nitride (5), with the formula of $Al_xGa_{1-x}N$ (0<x<1), usually doped into n-type. In order to reduce the mismatch of the crystalline lattice of the heterosubstrate 1 and the buffer layer 3 the nucleation layer 2 is placed between them, made e.g. of aluminum nitride. The presence of the nucleation layer 2 improves the crystalline quality of the nitride layers deposited above it, thus also improving the quality and parameters of the HEMT device. The HEMT transistor further contains electric contacts: source—7, gate—8 and drain—9. Contacts 7, 8 and 9 can be produced directly on the layer 5 or optionally on a contact layer 6. On the interface of the layers 5 and 3 a piezoelectric charge is created which accumulates near the interface in the buffer layer 3, forming a two-dimensional free electron gas 4 (2DEG) with high mobility. It is worth noting that the above effect is approximately five times stronger for the AlGaN/GaN system than for AlGaAs/GaAs. The charge carriers "generated" in the layer 5 "drop out" into the buffer layer 3, where they can freely move. Between the source 7 and the drain 9 a "channel" is created in which current flows. Changing the voltage applied to the gate 8 (located along the channel) causes a change in the resistance of the source-drain system (J. Klamka, "Heterozłązowe przyrządy półprzewodnikowe na zakres mikrofal i fal milimetrowych", Agencja Lotnicza ALTAIR sp. z o. o., $1^{st}$ edition (2002), ISBN: 83-86217-48-0). It is known ("Journal of Applied Physics", vol. 87, no. 1, 2000, pages 334-344) that the quality of the device improves with the quality of epitaxial layers, particularly the layers 3 and 5. In particular, it has been observed that the increase in thickness of the buffer layer 3 improves the interface of the layers 3 and 5, resulting in increased mobility of free carriers. This can be explained by the fact that as the thickness of the buffer layer 3 increases, the unfavorable effect of mismatch between the nitride layers of the HEMT structure and the heterosubstrate decreases.

Figure 2:
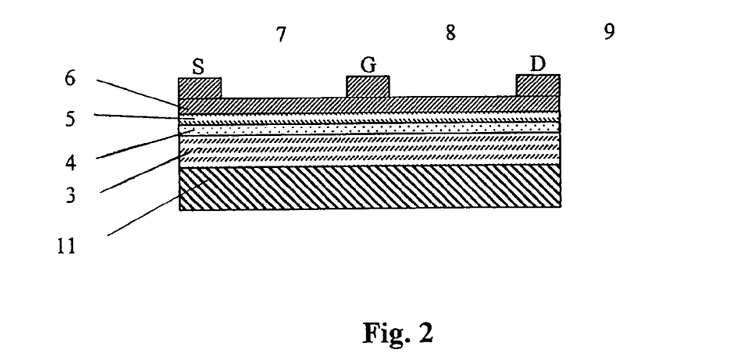
FIG. 2 shows a scheme of a HEMT structure according to the invention.

FIG. 2 presents a schematic cross-section of the HEMT structure according to the invention. The transistor is characterized in that is was obtained on a homosubstrate 11 (i.e. a substrate made of monocrystalline gallium-containing nitride), and thus it does not need to have a nucleation layer between the substrate 11 and the buffer layer 3. The buffer layer 3 deposited directly on homosubstrate 11 is itself much thinner than in the known nitride HEMT transistors obtained on heterosubstrates. The remaining elements of the HEMT transistor shown in FIG. 2 are the same as in the known HEMT structure shown in FIG. 1, and—for simplicity—they are marked with the same numerals in FIG. 1 and FIG. 2. Despite the thinner buffer layer 3 and the lack of a nucleation layer, the HEMT transistor according to the invention has an excellent structural quality, because—as a result of using the homosubstrate 11—there is no mismatch between the substrate and the nitride layers of the HEMT structure. Therefore, it is possible to obtain exceptionally favorable parameters and performance of the HEMT device according to the invention.

Substrates of monocrystalline gallium-containing nitride are obtained from bulk nitride monocrystals obtained by crystallization from supercritical ammonia-containing solution, such monocrystals contain Group I elements, in a concentration of at least 0.1 ppm. These substrates are disclosed in U.S. Patent Application Publication No. 2006-0037530 A1 and U.S. Pat. No. 7,314,517 related to publications—WO2004/053206 and WO2004/053208, and its abbreviated description is included below.

In this method, in the crystallization stage the system contains gallium-containing feedstock, preferably crystalline gallium nitride, Group I elements and/or their mixtures, and/or their compounds, particularly those containing nitrogen and/or hydrogen, preferably azides, possibly with the addition of Group II elements and/or their compounds constitute the mineralizer, and the mineralizer together with ammonia acts as the ammonia-containing solvent. Crystallization of the desired gallium-containing nitride is carried out from supercritical ammonia-containing solution on the surface of the seed at the crystallization temperature higher and/or crystallization pressure lower than the temperature and pressure of dissolution of feedstock. Two temperature zones are created and feedstock is placed in the dissolution zone while at least one seed is placed in the crystallization zone, and the dissolution zone is located above the crystallization zone and transport of mass occurs between the dissolution zone and the crystallization zone.

The difference in temperature between the dissolution zone and the crystallization zone is between 1° C. and 150° C., preferably between 10° C. and 100° C., and in the crystallization zone the temperature is not lower than 350° C., preferably not lower than 400° C., and most preferably between 500° C. and 550° C.

GaN shows good solubility in the supercritical $NH_3$ provided that it contains alkali metals or their compounds, such as $NaNH_2$ or $KNH_2$. The experiments carried out by the authors of this invention show that solubility is an increasing function of pressure and a decreasing function of temperature. On the basis of the determined relationships it is possible to produce the desired gallium-containing nitride crystals by crystallization from supercritical ammonia-containing solution.

Feedstock is placed in the reactor's upper zone. That zone is maintained under a different temperature than the reactor's lower zone, where at least one monocrystalline seed is placed.

In particular, the negative temperature coefficient of solubility of GaN in the reaction environment means that as a result of producing a temperature gradient it is possible to enforce in the system the chemical transport of gallium nitride from the reactor's upper zone with low temperature—being the dissolution zone of the crystalline gallium nitride acting as feedstock, to reactor's lower zone with higher temperature—being the crystallization zone.

Crystallization of gallium-containing nitride from supercritical ammonia-containing solution can be carried out, for example, in the device disclosed in the publication WO2002/101120. It is possible to use autoclaves that differ in terms of construction details as a result of, among others, the scale of the device.

This device is characterized in that it has an autoclave for producing a supercritical solvent, equipped with an internal installation for determining convection flow. The autoclave is mounted inside a set of furnaces, equipped with heating devices and/or cooling devices.

The set of furnaces has a high-temperature zone that coincides with the crystallization zone of the autoclave, equipped with heating devices and/or cooling devices as well as a low-temperature zone that coincides with the dissolution zone of the autoclave, equipped with heating devices and/or cooling devices. The internal installation has a horizontal baffle (or horizontal baffles) with central and/or circumferential openings, which separate the crystallization and dissolution zones. In the autoclave the feedstock is placed in the dissolution zone and at least one seed is placed in the crystallization zone, while the flow of supercritical solution between the dissolution and crystallization zones is determined by the internal installation. The dissolution zone is located above the horizontal baffle or horizontal baffles, while the crystallization zone is located below the horizontal baffle or horizontal baffles.

Gallium-containing nitride monocrystal, obtained using any available method, in the form of a wafer oriented perpendicularly with respect to the c axis of the monocrystals, having the surface dislocation density of no more than $10^8/cm^2$, is used as the seed for producing the bulk monocrystal.

Usually when producing bulk gallium-containing nitride monocrystals, wafers of gallium-containing nitride obtained using the HVPE method are used as the seeds. This is favorable because the method allows to obtain GaN monocrystals in the form of wafers with relatively large surface. By using such seeds it is possible to obtain bulk gallium nitride monocrystals with a very low dislocation density as well as considerable thickness. Such material is perfect for substrates for epitaxial deposition of semi-conductor layers.

Moreover, it is preferable to use a gallium-containing nitride monocrystal in the form of a wafer with at least one non-polar surface as the seed, and growth in the direction perpendicular to the c axis of the monocrystals is carried out on the seed.

The proper dimensions and shape of seeds for producing bulk monocrystalline gallium-containing nitride can be achieved by subjecting the seed to preliminary processing, consisting in alternate growth in the direction parallel to the c axis and in the direction perpendicular to the c axis of the crystalline lattice of gallium-containing nitride. The alternate growth of the crystal in the desired directions is achieved by, for example, applying alternate growth from supercritical ammonia-containing solution in the direction parallel to the c axis and in the direction perpendicular to the c axis, by alternately exposing the growth planes in the desired direction while simultaneously limiting the growth in the perpendicular direction in the subsequent stages. Examples of the means of limiting the growth of gallium-containing nitride in the desired direction are disclosed in the publication WO2003/035945.

In a typical example of crystallization from supercritical ammonia-containing solution disclosed in publications WO2004/053206 and WO2004/053208, the growth on the seed occurs essentially in the direction consistent with the direction of growth of the seed. However, in a preferable variant disclosed in the Polish patent application no. P-368781, the bulk gallium-containing nitride monocrystal is preferably produced by growth in the direction perpendicular to the direction of growth of the seed. Moreover, according to the teaching of the patent application no. P-368781, it is possible to combine the growth on the seed in the direction essentially parallel to the direction of growth of the seed and in the direction perpendicular to it. Preferably, therefore, the bulk monocrystalline gallium-containing nitride is produced by controlled growth of the monocrystal in the selected direction, including at least one growth stage in the direction perpendicular to the c axis of the monocrystal and at least one growth stage in the direction parallel to the c axis of the monocrystal in supercritical ammonia-containing solution, using the feedstock and the seed in each of those stages and possibly repeating the growth stages in the direction perpendicular to the c axis and in the direction parallel to the c axis, until the desired dimensions of the monocrystal are achieved along at least one of its axes.

The results of the tests of thus obtained monocrystals confirm that in such a case it is possible to obtain a very good crystalline quality of the monocrystalline gallium-containing nitride. Thus obtained wafers have a very large curvature radius of the crystalline lattice, exceeding 15 m, preferably over 30 m, and most preferably over 70 m, while the curvature radius of the crystalline lattice of the monocrystals grown in the same direction as the direction of growth of the seed (parallel to the c axis) is typically about 2-15 m. At the same time, the half width of the X-ray rocking curve (FWHM) of the monocrystals is preferably below 40 arcsec. Moreover, the growth on the seed in the direction perpendicular to the c axis allows to obtain bulk monocrystals from which, subsequently, it is possible to cut out wafers of the desired orientation with respect to the nitride crystalline lattice and the desired polarity (e.g. with the surface coinciding with the polar C plane, or with the surface coinciding with the non-polar A or M plane of the crystalline lattice of gallium-containing nitride). Such wafers can be then used to make polar or non-polar substrates for epitaxy. Moreover, the monocrystals contain Group I elements, in a concentration of at least 0.1 ppm.

Gallium-containing nitride or its precursor is used as the feedstock. The application of crystalline gallium nitride as the feedstock in the GaN crystallization process is preferable due to the fact that it ensures the quantity of gallium required to carry out the process in the easily soluble form that can be gradually transformed into the solution.

Alkali metals, their compounds—especially those containing nitrogen and hydrogen, and their mixtures can be used as the mineralizer. Alkali metals can be selected from among Li, Na, K, Rb and Cs, and their compounds can be selected from among hydrides, amides, imides, amido-imides, nitrides and azides.

The environment of supercritical ammonia-containing solution with the addition of alkali metal ions, used for producing bulk gallium nitride monocrystals, can also contain ions of other metals and soluble forms of other elements intentionally introduced in order to modify the properties of the monocrystalline gallium nitride being produced. However, this environment also contains random impurities introduced with initial materials and released to this environment from the elements of the equipment during the process. It is possible to limit the content of the random impurities by using reagents of a very high purity, or even additionally purified for the purpose of the process. The impurities from the equipment are also controlled through the selection of construction materials, in accordance with the principles applied by those skilled in art.

Example 1 below presents the process of controlled growth of a gallium-containing nitride crystal by crystallization from supercritical ammonia-containing solution, illustrated by the graph presenting the relationship between temperature and duration of the process presented in FIG. 3.

Figure 3:
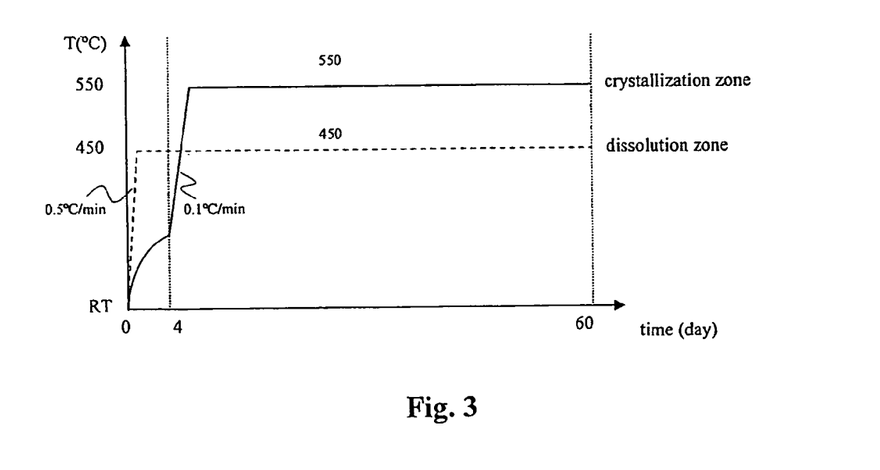
FIG. 3 shows the change of temperature in time in a process described in Example 1 and FIG. 4 shows the change of temperature in time in a process described in Example 2.

According to FIG. 3, in the stage of crystallization from supercritical ammonia-containing solution, in the upper zone—being the dissolution zone of the autoclave, lower temperature is maintained than the temperature in the crystallization zone, which is essentially kept at a steady level throughout the entire stage of crystallization.

Under such conditions—as a result of creating a difference in temperatures between the zones and a temperature gradient—the feedstock is dissolved in the dissolution zone, and, as a result of convection, a chemical transport is evoked between the zones and, by achieving the state of supersaturation of supercritical ammonia-containing solution with respect to GaN in the crystallization zone, selective crystallization of GaN on the seed is carried out.

During the growth from supercritical ammonia-containing solution, the difference in temperature between the zones can be significantly changed and is preferably between several and several dozen degrees centigrade. Additionally, the difference in temperature between the zones can be changed during the process. Thus, it is possible to control the growth rate and the quality of the bulk monocrystalline gallium nitride being produced.

The bulk monocrystalline gallium-containing nitride obtained using the above-described method can be doped with donor- and/or acceptor- and/or magnetic-type dopants, at the concentration from $10^{17}/cm^3$ to $10^{21}/cm^3$. The doping causes the obtained gallium-containing nitride to become n-type material, p-type material, or compensated (semi-insulating) material, the latter being a preferred homosubstrate for nitride HEMT.

The doping is carried out by introducing appropriate dopants into the environment of monocrystal growth. In the case of Group XIII element nitrides, particularly gallium nitride, examples of acceptor-type dopants include magnesium and zinc, donor-type dopants—silicon, and magnetic-type dopants—manganese. The above-listed elements can be introduced into the process environment together with initial materials in pure (elemental) form or as compounds. Those can be practically any compounds of the above-mentioned elements, provided that the presence of the compounds in the process environment does not significantly disturb the functions or the ammonobasic nature of the supercritical ammonia-containing solution.

Doping attempts, in which the acceptor-type dopants, as e.g. zinc or magnesium, were introduced into the environment of the process, encountered technological obstacles. The presence of said elements in the environment of the process according to the disclosure of WO2004/053206 and WO2004/053208 resulted in a dramatic drop of the growth rate of nitride crystals, and consequently monocrystals of desired size could not be obtained. Unexpectedly, these obstacles have been overcome by optimizing the parameters of the crystallization process, such as pressure and the temperature distribution, as well as preparation of feedstock in the form of alloy of gallium with zinc and/or magnesium with appropriate composition. Preferably the moral ratio of zinc or magnesium to gallium in said alloy was equal to ca. 500 ppm.

In particular, zinc or magnesium doping at approximately 500 ppm allows to obtain a compensated (semi-insulating) gallium-containing nitride with resistivity of approximately $10^6 \Omega \cdot cm$, optimal for producing substrates for nitride HEMT transistors. Examples 1 and 2 show the process of crystal growth, doping and production of substrates.

Substrates are produced by cutting gallium-containing nitride monocrystals (e.g. with a wire saw) into wafers with the desired dimensions and orientation with respect to the nitride crystalline lattice. By a typical processing method, consisting of—among others—mechanical polishing and chemical mechanical planarization (CMP) of the wafers, non-conductive substrates for epitaxy are obtained, on which HEMT type structures are produced later on.

According to the invention, the HEMT structure is produced on thus obtained substrate using epitaxial methods, such as MOCVD, HVPE or MBE. Each of those methods is appropriate. The thus obtained structures are characterized by a very high crystalline quality of the layers and the problems caused by substrate mismatch, parasitic conduction etc. are absent. In particular, Examples 3-6 present HEMT transistors according to the invention, manufactured by the MOCVD method. These transistors have exceptionally favorable performance parameters (for example, mean output power in the W-CDMA band (ca. 2 GHz)—50 W, gain 25 dB at 60V).

If the HEMT structure consists of layers made by epitaxial methods, the appropriate direction of growth of these layers is important. Preferably, the substrate is cut out of the bulk single crystal in such a way that the direction of growth of the substrate (which is the main direction of propagation of dislocations in the substrate) is parallel to the epitaxial surface of the substrate. In this case, the direction of growth of epitaxial layers on the substrate is perpendicular to the direction of growth of the substrate. As the result, the defects present in the substrate do not propagate into the epitaxial layers. Consequently, an important element of this invention is a method of manufacturing of HEMT transistors, in which at least the buffer layer 3 is produced by epitaxial methods and the direction of growth of said layer in an epitaxial process is essentially perpendicular to the direction of growth of the substrate 11.

Along with the exceptionally favorable operating parameters and performance, HEMT transistors according to the invention are also very competitive economically. The manufacturing cost of such transistors has been cut down since the epitaxial methods (available and industrially applied on a mass scale) are used for its production, provided that appropriate homo-substrates are used.

The present invention is further illustrated in the following examples, serving only as an illustration. The examples are intended to illustrate the invention only and should not be construed as limiting in any way the scope of the present invention, as defined by the claims.

Example 1

Obtaining of Insulating Homosubstrate for HEMT from Compensated Monocrystalline Gallium Nitride In a high-pressure 600 cm³ autoclave, in the dissolution zone the feedstock in the form of 105 g (ca. 1.5 mol) of 6N metallic gallium was placed with the addition of 0.05 g of zinc or 0.02 g of magnesium. Next, 28 g (ca. 1220 mmol) of 4N metallic sodium was introduced into the autoclave.

Nine wafers of monocrystalline gallium nitride, obtained by HPVE method or by crystallization from supercritical ammonia-containing solution, having a pair of surfaces oriented perpendicular to the c axis of the monocrystal, with the diameter of approx. 25 mm (1 inch) and thickness of ca. 500 μm each were used as seeds. The seeds were placed in the crystallization zone of the autoclave.

Next, the autoclave was filled with 240 g of ammonia (5N), closed and placed in the set of furnaces.

The dissolution zone was heated (at approx. 0.5° C./min) to 450° C. During that time the crystallization zone was not heated. After the assumed temperature of 450° C. was reached in the dissolution zone (i.e. after approx. 15 hours since the beginning of the process—FIG. 3), the temperature in the crystallization zone reached approximately 170° C. Such distribution of temperature was maintained in the autoclave for 4 days (FIG. 3). During that time partial transition of gallium to the solution and complete reaction of the remaining gallium to polycrystalline GaN took place. Next, the temperature in the crystallization zone was raised (at approx. 0.1° C./min) to 550° C., and the temperature in the dissolution zone remained unchanged. The pressure inside the autoclave was approx. 410 MPa. As a result of such distribution of temperature, convection between the zones occurred in the autoclave, causing chemical transport of gallium nitride from the dissolution (upper) zone to the crystallization (lower) zone, where it was deposited on the seeds. The obtained distribution of temperature (i.e. 450° C. in the dissolution zone and 550° C. in the crystallization zone) was subsequently maintained for the next 56 days (until the end of the process—FIG. 3).

As a result of the process, partial dissolution of the feedstock (i.e. polycrystalline GaN) occurred in the dissolution zone and growth of monocrystalline gallium nitride occurred on both sides of each of the seeds, in the form of monocrystalline layers with the total thickness of approximately 3.5 mm (on each seed, measured along the c axis of the monocrystal). The obtained gallium nitride monocrystals were characterized by the half width of the X-ray rocking curve (FWHM) from the (0002) plane equal to approx. 20 arcsec (for the Cu K $\alpha_1$ line) and the curvature radius of the crystalline lattice of 50 m. Microscopic examination of the C surface of those crystals (on the N-terminated side) showed that the surface dislocation density, as measured by the Etch Pit Density (EPD) method, was $2 \times 10^2/cm^2$. In terms of electric properties, the obtained material was compensated (semi-insulating), with the resistivity of approximately $10^6 \Omega \cdot cm$.

Thus obtained crystals were cut using a wire saw into wafers having the diameter of approx. 25 mm (1 inch) and thickness of approximately 300 μm each and having a pair of surfaces oriented perpendicularly to the c axis of the crystalline lattice (polar). In another preferable embodiment of the process of growth of gallium-containing nitride monocrystal, the obtained crystal was cut into wafers having a pair of surfaces oriented perpendicularly to the a or m axis of the crystalline lattice (non-polar). The wafers were subjected to typical processing consisting—among others—of mechanical and chemical mechanical planarization (CMP) in order to obtain hexagonal 1-inch non-conductive substrates for epitaxy, on which subsequently HEMT-type structures were obtained.

Example 2

Obtaining of Insulating Homosubstrate for HEMT from Compensated Monocrystalline Gallium Nitride According to the disclosure of WO 02/101120, dissolution zone of a 1350 cm$^3$ high-pressure autoclave was charged with gallium-containing feedstock, seeds, mineralizer and ammonia.

Large crystals, in the form of wafers, having the shape close to isosceles triangles with the base ca. 85 mm long and the angles at the base equal to 30°, were used as seeds. The surface of the seed coincided with the C crystalline plane of the gallium nitride crystalline lattice. Such seeds were obtained by merging smaller GaN crystals in the supercritical ammonia-containing solution, by the method disclosed in the Polish patent application no. P-371405. The seeds were placed in the crystallization zone of the autoclave in a way enabling free growth on the seeds.

Figure 4:
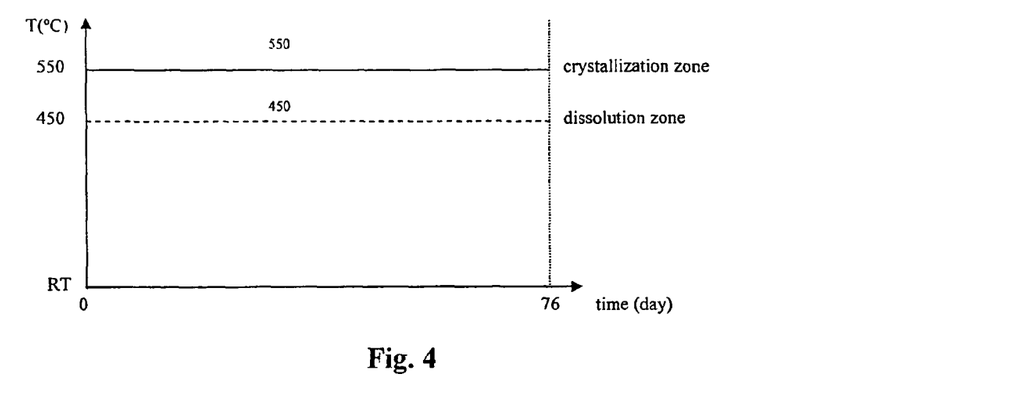

Metallic sodium was used as the mineralizer. The feedstock was placed in the dissolution zone, while the seeds were mounted in the crystallization zone. The crystallization process on the seeds was carried out under constant temperature conditions of $T_2=550°$ C. in the crystallization zone and $T_1=450°$ C. in the dissolution zone. This temperature distribution inside the autoclave was maintained for 76 days (FIG. 4). At such conditions the pressure within the autoclave was ca. 410 MPa.

As the result of the process partial dissolution of the feedstock (i.e. polycrystalline GaN) took place in the dissolution zone. In the crystallization zone further growth of monocrystalline gallium nitride on the seeds, in the direction parallel to the c crystalline axis, as well as in the direction perpendicular to the c crystalline axis was observed. The obtained crystals had the shape close to a rhombus. They were about 6 mm thick. The longest diagonal of the rhombus was about 85 mm long, while the width of the rhombus (measured in the direction perpendicular to the longest diagonal) was about 30 mm. Two circular wafer-like crystals, free of defects, were cut out of each of the crystals. The half width of the X-ray rocking curve (FWHM) from (0002) plane (for the Cu K α1 line) of the thus-obtained 1-inch crystals was equal to 20 arcsec, while the radius of curvature of its crystalline lattice was equal to 38 m. Microscopic investigations of the C-face of the crystals showed that the surface dislocation density (measured by Etch Pit Density—EPD method) for this face was about $2\times10^2/cm^2$. As far as the electrical properties are concerned, they were similar to those given in Example 1.

The thus-obtained crystals were sliced into wafers having a pair of surfaces oriented perpendicularly to the c axis of the crystalline lattice (polar). The wafers were subjected to typical processing consisting—among others—of mechanical and chemical mechanical planarization (CMP) in order to obtain hexagonal 1-inch non-conductive substrates for epitaxy. In this case, the direction of growth of the thus obtained seeds was essentially perpendicular to the c axis of the crystalline lattice. Subsequently HEMT-type structures were obtained one the substrates.

Example 3

HEMT Transistor According to the Invention Manufactured on the Homosubstrate Obtained in Example 1

FIG. 2 presents a schematic cross-section of the HEMT transistor according to this invention. According to FIG. 2, on a substrate of gallium nitride 11, obtained in the process described in Example 1, the buffer layer 3 of undoped gallium nitride was deposited using the MOCVD method, with the thickness of 0.5 μm, as well as the layer 5 of $Al_{0.3}Ga_{0.7}N$, doped with Si at approx. 500 ppm and with the thickness of 10 nm. Next, electric contacts of Ni—Ti—Au were produced: source 7, gate 8, and drain 9. Optionally, before making the contacts, a contact layer 6 was formed on the layer 5. Thus obtained HEMT transistor was characterized by exceptionally favorable operating parameters (for example, mean output power in the W-CDMA band (ca. 2 GHz)—50 W, gain 25 dB at 60V).

Example 4

HEMT Transistor According to the Invention Manufactured on the Homosubstrate Obtained in Example 1

The same procedures were followed as in Example 3, with the only exception that the layer 5, having the thickness of approx. 10 nm, was made of $Al_{0.4}Ga_{0.7}N$, doped with Si at approx. 500 ppm. This enabled to obtain a higher average output power—55 W in the W-CDMA band (ca. 2 GHz), while the other parameters of the device were similar as in Example 3.

Example 5

HEMT Transistor According to the Invention Manufactured on the Homosubstrate Obtained in Example 2

The same procedures were followed as in Example 3, with the only exception that the substrate obtained in Example 2 was used. As the result, the growth of layers 3 and 5 (having identical composition and parameters as in Example 3) by MOCVD method was conducted in the direction essentially perpendicular to the direction of growth of the substrate, which is one of the elements of the present invention. Thus obtained HEMT device was characterized by even more favorable operating parameters (for example, mean output power in the W-CDMA band (ca. 2 GHz)—60 W, gain 35 dB at 60V).

Example 6

HEMT Transistor According to the Invention Manufactured on the Homosubstrate Obtained in Example 1

The same procedures were followed as in Example 3, with the only exception that a T-shaped gate was formed, which enabled to additionally reduce the gate-resistance noise. The obtained transistor was characterized by operating parameters more favorable than that in Example 3: mean output power in the W-CDMA band (ca. 2 GHz)—52 W, gain 28 dB at 63V

LIST OF REFERENCE NUMERALS

1—heterosubstrate (e.g. made of sapphire, silicon or SiC)
2—nucleation layer
3—buffer layer (GaN)
4—two dimensional electron gas (2DEG) on the interface of layers 3 and 5.
5—$Al_xGa_{1-x}N$ (0<x<1) layer
6—contact layer (optional)
7—source
8—gate
9—drain
11—homosubstrate (substrate made of GaN)

The invention claimed is:

1. High Electron Mobility Transistor (HEMT), comprising layers of at least one Group XIII element nitride (IUPAC, 1989), wherein said high electron mobility transistor includes a substrate of a gallium-containing nitride, said substrate being made of a single crystal obtained by crystallization from a supercritical ammonia-containing solution, said substrate having a surface dislocation density approximately $10^2/cm^2$ and said substrate has a curvature radius of crystalline lattice exceeding 15 m and wherein a two-dimensional electron gas (2DEG) is present in a layer adjacent to said substrate, and wherein said substrate is made of a single crystal obtained by growth on a seed, wherein at least a part of the single crystal is grown only in one direction at a time, the one direction at a time including in a direction essentially perpendicular to a direction of seed growth or in a direction essentially parallel to a direction of seed growth.

2. The transistor according to claim 1, wherein said substrate is semi-insulating.

3. The transistor according to claim 1, wherein said substrate is polar.

4. The transistor according to claim 1, wherein said substrate is non-polar.

5. The transistor according to claim 1, wherein at least the layer adjacent to said substrate is produced by epitaxial methods and a direction of growth of said layer in the epitaxial process is essentially perpendicular to a direction of growth of said substrate.

6. The transistor according to claim 1, wherein said substrate has a curvature radius of crystalline lattice exceeding 30 m.

7. The transistor according to claim 6, wherein said substrate has a curvature radius of crystalline lattice exceeding 70 m.

8. The transistor according to claim 1, wherein said substrate has a half width of an X-ray rocking curve (FWHM) below 40 arcsec.

9. A method of making a High Electron Mobility Transistor (HEMT), comprising the steps of:

forming a substrate of a single crystal of a gallium-containing substrate by crystallization from a supercritical ammonia-containing solution grown on a seed, only in one direction at a time, the one direction at a time including in a direction essentially perpendicular to a direction of seed growth or in a direction essentially parallel to a direction of seed growth, the substrate having a surface dislocation density approximately $10^2/cm^2$ and said substrate has a curvature radius of crystalline lattice exceeding 15 m;

forming a first layer comprising at least one Group XIII element nitride (IUPAC, 1989) on the substrate, forming a second layer on the first layer, the second layer comprising a nitride different than the first layer, and whereby a two-dimensional electron gas (2DEG) is present in the first layer.

10. The method of making a High Electron Mobility Transistor according to claim 9, further comprising the step of producing at least the buffer layer by epitaxial methods, wherein the direction of growth of said layer in the epitaxial process is essentially perpendicular to the direction of growth of the substrate.

11. The method of making a High Electron Mobility Transistor according to claim 9, wherein said step of forming a substrate includes forming a substrate that has a curvature radius of crystalline lattice exceeding 30 m.

12. The method of making a High Electron Mobility Transistor according to claim 11, wherein said step of forming a substrate includes forming a substrate that has a curvature radius of crystalline lattice exceeding 70 m.

13. High Electron Mobility Transistor (HEMT), comprising layers of at least one Group XIII element nitride (IUPAC, 1989), wherein said high electron mobility transistor includes a substrate of a gallium-containing nitride, said substrate being made of a single crystal obtained by crystallization from a supercritical ammonia-containing solution, said substrate having a surface dislocation density approximately $10^2/cm^2$ and wherein a two-dimensional electron gas (2DEG) is present in a layer adjacent to said substrate and wherein said substrate is made of a single crystal obtained by growth on a seed, wherein at least a part of the single crystal is grown only in one direction at a time, the one direction at a time including in a direction essentially perpendicular to a direction of seed growth or in a direction essentially parallel to a direction of seed growth, and said substrate is semi-insulating and has a curvature radius of crystalline lattice exceeding 15 m, and wherein the HEMT has a mean output power in the W-CDMA band not lower than 50 W and a gain not lower than 25 dB and 60V.

14. The transistor according to claim 13, wherein said substrate has a curvature radius of crystalline lattice exceeding 30 m.

15. The transistor according to claim 14, wherein said substrate has a curvature radius of crystalline lattice exceeding 70 m.

* * * * *